United States Patent [19]

Simmons et al.

[11] Patent Number: 5,301,369
[45] Date of Patent: Apr. 5, 1994

[54] CIRCUIT WITH ADJUSTABLE RELEASE TIME

[75] Inventors: John W. Simmons, Tamarac; Virgilio A. Fernandez, Sunrise; Norman T. Rollins, Plantation, all of Fla.

[73] Assignee: Motorola, Inc., Schaumburg, Ill.

[21] Appl. No.: 862,707

[22] Filed: Apr. 3, 1992

[51] Int. Cl.[5] .............................. H04B 1/46
[52] U.S. Cl. ........................ 455/79; 455/83
[58] Field of Search ............ 307/263, 228; 328/182, 328/185; 455/79, 116, 83, 89, 80

[56] References Cited

U.S. PATENT DOCUMENTS

| | | | |
|---|---|---|---|
| 4,216,393 | 8/1980 | Gillberg et al. | 307/263 |
| 4,882,762 | 11/1989 | Waldhauer | 455/72 |
| 5,008,954 | 4/1991 | Oppendahl | 455/79 |
| 5,128,555 | 7/1992 | Millman | 307/263 |
| 5,134,308 | 7/1992 | Boemi | 307/263 |
| 5,187,686 | 2/1993 | Tran et al. | 307/263 |

FOREIGN PATENT DOCUMENTS 0031583 7/1981 European Pat. Off. ........... 307/263

Primary Examiner—Reinhard J. Eisenzopf
Assistant Examiner—Nguyen Vo
Attorney, Agent, or Firm—Pedro P. Hernandez

[57] ABSTRACT

A circuit (100) is provided which includes a forward charging switch (FET MN2) having an input terminal (102), an output terminal 112 and a plurality of current sink elements (FETs MN1 and MN3). The plurality of current sink elements (MN1 and MN3) are selectable via a control switch circuit (114) which is responsive to a control signal at the control switch input terminal (104). Preferably, one of the current sinks is always selected in order for some small amount of current to be discharged from output terminal 112 which is coupled to a capacitor (C1).

6 Claims, 6 Drawing Sheets

CIRCUIT WITH ADJUSTABLE RELEASE TIME

TECHNICAL FIELD

This invention relates generally to electronic circuits and more specifically to an electronic circuit having adjustable release time.

BACKGROUND

In electronic circuits such as voice operated control (VOX) and automatic gain control (AGC) circuits which are used in two-way radios, the release time section of the VOX or AGC circuit controls how fast the voltage on the output capacitor of the VOX or AGC circuit falls as a function of time. As the release time becomes shorter, the output voltage of the circuit falls quickly, yielding a fast increase in gain. This quick fall in voltage (e.g., increase in gain) causes a phenomenon known as noise pulsing. Noise pulsing occurs when for example the gain in an AGC circuit ramps up very quickly between words or phrases and the background noise becomes amplified. The end result is that during a break in words, a rushing sound similar to the sound a waterfall makes occurs.

The opposite end of the spectrum is when the release time in the AGC circuit is set for a longer period of time (e.g., 5 second region). When a word having a very sharp consonant sound (e.g., words beginning with b, p or t) is spoken into the radio microphone, the sharp consonant sound causes the gain of the AGC circuit to decrease too much and then ramp up very slowly. When this occurs, the first part of the word is lost when the word is transmitted by the radio. For example, if a word like "pirate" were spoken, the radio microphone would react to this rush of air (caused by the "p" sound) as a very loud tone and produce a large output voltage. The AGC circuit in turn reacts to the large output voltage very quickly and tries to reduce the magnitude to a predetermined level. This causes the next portion of the spoken word to be reduced, or even eliminated, by the AGC circuit action previously mentioned. The end result, if the AGC circuit were enabled with a long release time, would be that a word like "pirate" would sound like "p . . . te" at the receiving radio. VOX circuits face similar problems to those mentioned above, given that the peak detector capacitor of the circuit is affected by similar release time problems.

Prior art circuits having release time sections have a major drawback in that most of the prior art circuits require manual change of circuit components in order to adjust the release time of the circuit. Also, prior art circuits tend to be temperature sensitive due to variations in the components such as the discharge resistor, etc. Other drawbacks of prior art circuits include not being able to provide for long release times (e.g., in the order of 5 seconds) due to the exponential discharge characteristics of RC circuits. Another problem with prior art circuits that use a diode as the forward charging switch is that the inherent resistance of the diode causes attack times to be longer. A need thus exists for a circuit which can solve the above mentioned problems and can also have an externally adjustable release time without the need to change external circuit components.

SUMMARY OF THE INVENTION

Briefly, according to the invention, there is provided a circuit for sourcing and sinking current which includes a current sourcing means having an input and output terminal. The current sourcing means is responsive to a control signal at its input terminal for sourcing current to the output terminal. The circuit also includes a current sinking means for sinking current from the current sourcing means output terminal. The current sinking means includes a release time control terminal and a plurality of current sink switches each coupled to a corresponding current sink element. The plurality of current sink switches are coupled to the current sourcing mean's output terminal with at least one of the plurality of current sink switches being operatively responsive to a release time control signal at the release time control terminal for changing the rate at which current is sunk from the current sourcing output terminal.

DETAILED DESCRIPTION OF THE PREFERRED EMBODIMENT

Figure 1:
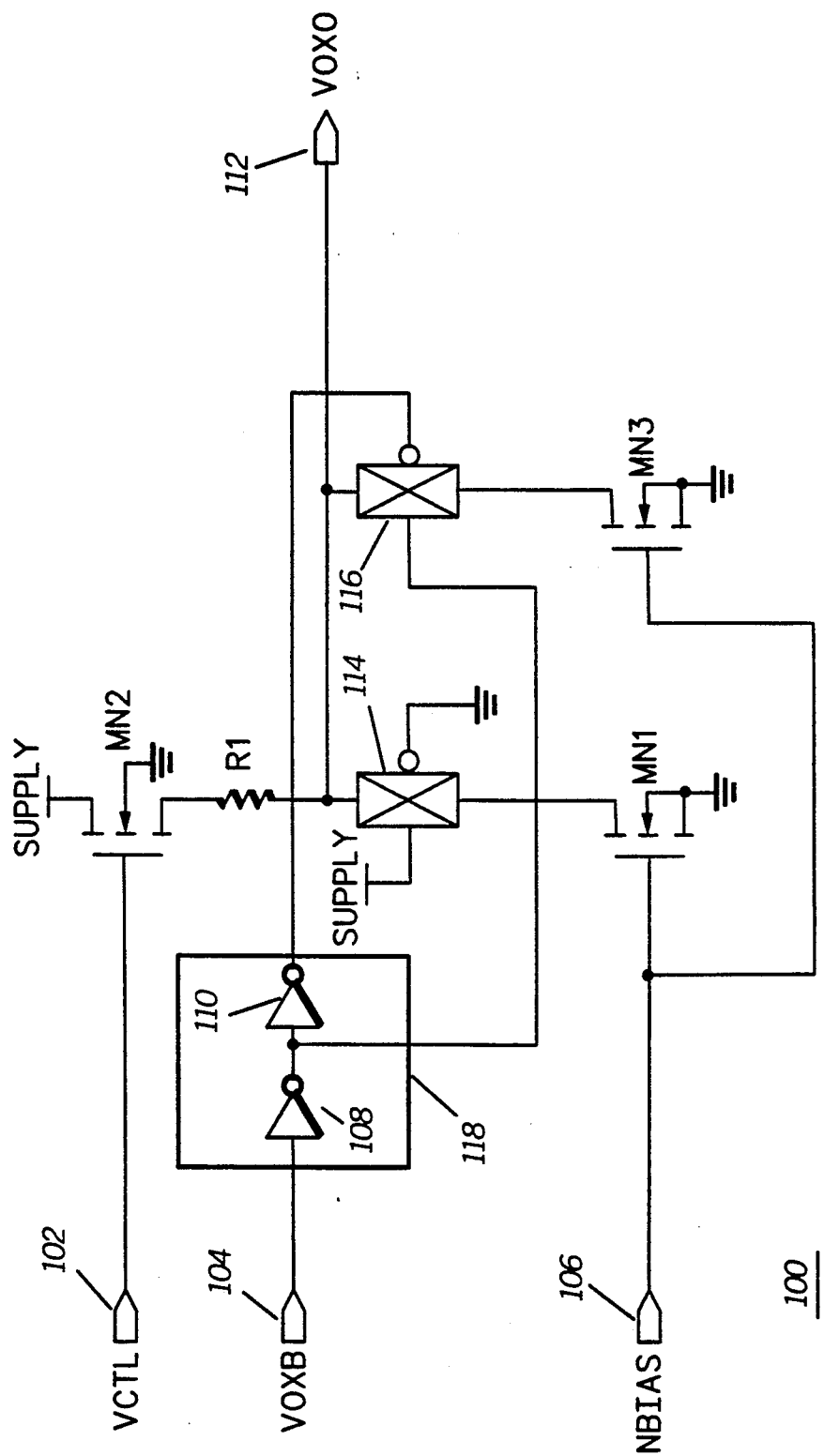
FIG. 1 is a schematic of a circuit with adjustable release time in accordance with the present invention.
Figure 3:
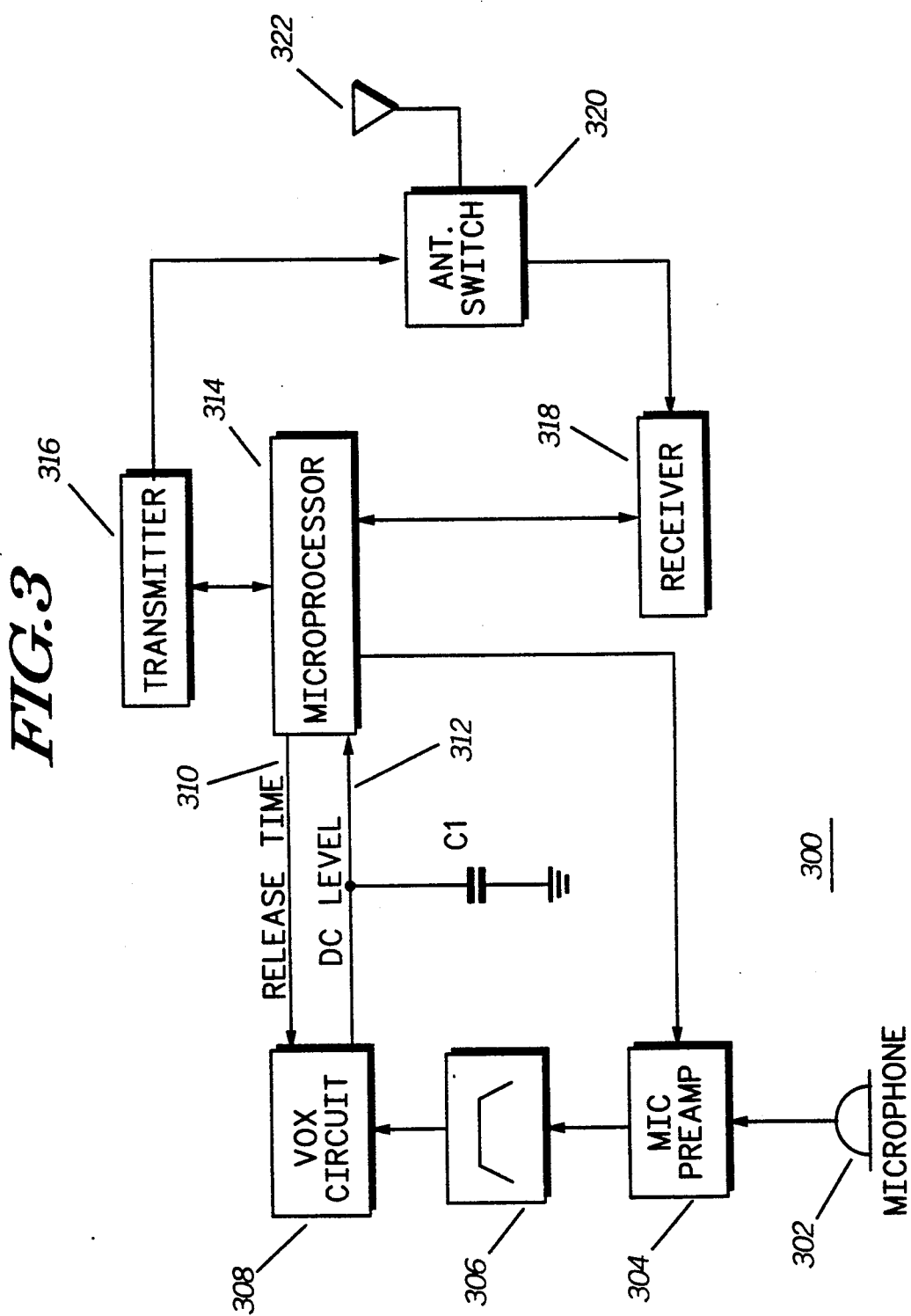
FIG. 3 is a block diagram of a radio utilizing a VOX circuit in accordance with the present invention.

In FIG. 1, there is shown a schematic of a VOX circuit 100 with adjustable release time in accordance with the present invention. Circuit 100 controls the charging and discharging of an external capacitor (the capacitor C1 is shown in FIG. 3, is coupled to output terminal 112). The capacitor C1 is charged through a current sourcing means such as an N-channel field-effect transistor (FET) MN2. FET MN2 acts as the forward charging switch or "attack time FET" for circuit 100. The source terminal of FET MN2 is connected to resistor R1 which is connected in turn to output terminal VOXO 112. The use of a FET provides for a very fast attack time while allowing long release times when the FET is biased "off" when a "low" (e.g., $V_{Gate\ to\ Source} < V_{threshold}$) input signal is present at the circuit's input terminal VCTL 102.

A resistor R1 is provided for protecting circuit 100 from exhibiting "ringing". A typical value for resistor R1 is 500 ohms, although this value can vary depending on the circuits application. The external capacitor (not shown) is constantly being discharged by a programmable current sink means which is comprised of current sink switches, such as fully complimentary logic gates (analog gates) 114 and 116, and current sink elements such as N-channel FETS MN1 and MN3. The slow current drain provided through switches 114 and 116 via FETS MN1 and MN3 allows for a slow linear voltage decay as compared to the exponential decay caused by the discharge resistor in prior art circuits.

A release time control terminal VOXB 104 controls the rate of current drain from output terminal VOXO 112 by switching in more current sink elements (by turning "on" or "off" switch 116, in FIG. 1 switch 114 is always "on"). The amount of current each current sink switch/FET combination path is able to sink is determined by how each of the current sink switches 114 and 116, and FETs MN1 and MN2, are implemented (physical size of FET when integrated into IC) prior to circuit 100 being integrated. For example, assuming a 2.2 $\mu$F capacitor is connected to output terminal 112, the path via FET MN1 could be designed to sink 2.5 $\mu$A while the path through FET MN3 can be designed to sink 1 $\mu$A. Therefore, if switch 116 is energized by sending a control signal to release time control terminal 104 a total of 3.5 $\mu$A will be sunk from the capacitor. As more branches (combination of switch and FETs) are added to circuit 100, more discrete current sinking states will be available to select from.

A control switch circuit 118 comprising logic circuits 108 and 110 (inverters) provides the logic for selecting the current sink switches to be turned on. In this particular embodiment, switch 114 is always "on", allowing current to drain via FET MN1 while switch 116 is switched "on" or "off" depending on the control signal present at the release time control terminal VOXB 104.

Although shown with only two current sink switches 114 and 116, those skilled in the art will appreciate that any number of switches and current sink FETS can be controlled giving an unlimited number of current discharge levels. Preferably a control means such as a microprocessor will provide the control signal to the release time control terminal VOXB 104 in order to control the amount of current sink for circuit 100. A bias terminal NBIAS 106 coming from a conventional Wilson or other well known biasing circuit sets the bias point for FETs MN1 and MN3. The size of the FETs when integrated will determine the amount of current each of the FET branches can sink.

Figure 2:
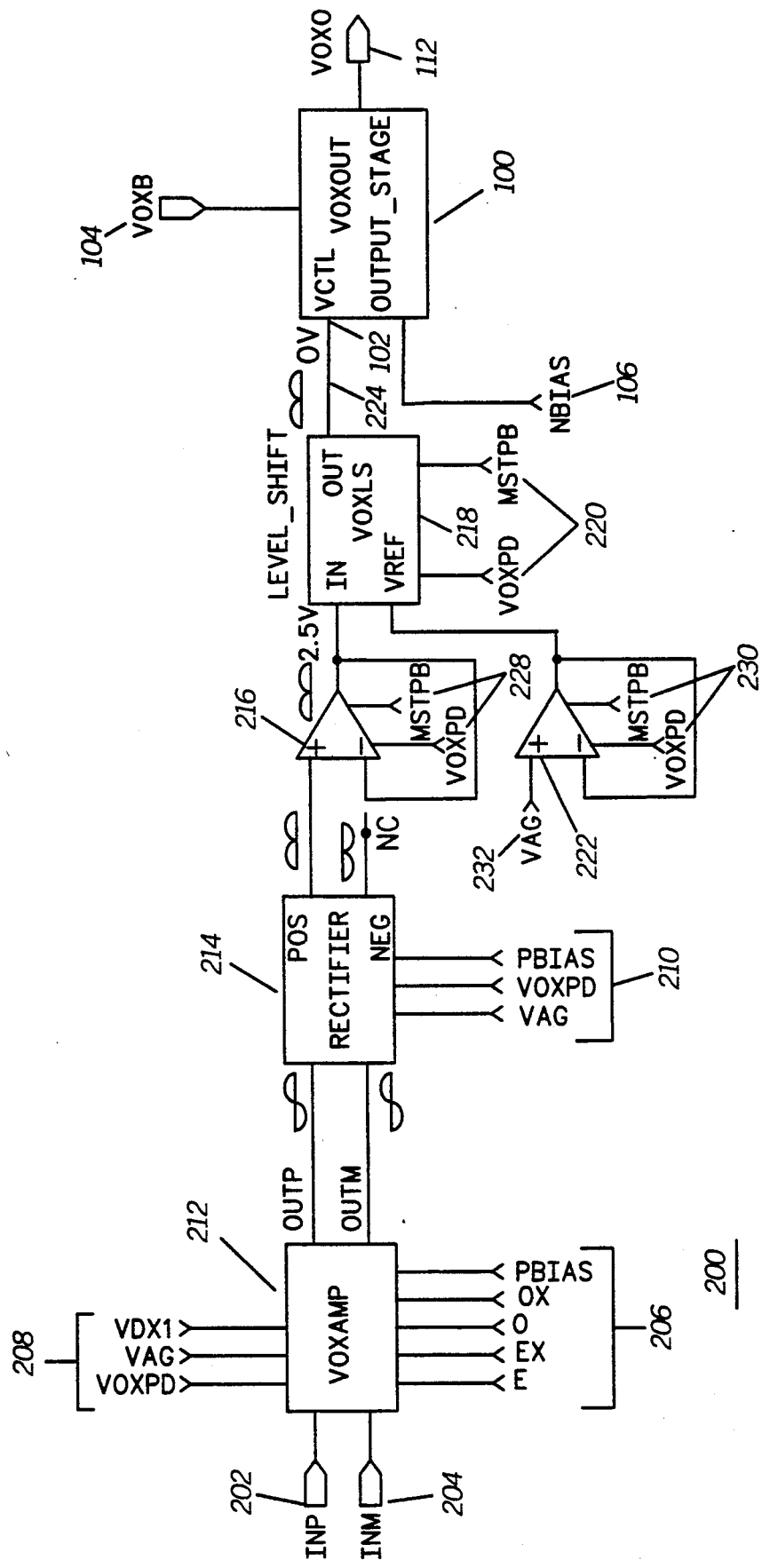
FIG. 2 is a block diagram of a VOX circuit in accordance with the invention.

In FIG. 2, a block diagram of a VOX circuit 200 in accordance with the invention is shown. A differential signal usually from a microphone circuit (not shown) of a radio comes into differential input terminal 202 INP and 204 INM. The differential input signal is amplified by a conventional audio amplifier 212. Amplifier 212 includes a plurality of control and bias terminals 206 and 208 which are used to control the amount of gain provided by amplifier 212. The amplified signal is then sent to a conventional rectifier circuit 214 where the full wave signal is converted into positive and negative half-wave signals. Rectifier 214 also includes a plurality of control terminals 210. The positive half-wave signal is sent to a buffer 216 before the half-wave signal is sent to a conventional level-shifting and amplifying circuit 218 where the half-wave signal floor is level shifted from 2.5 volts down to 0 volts. Level shifting circuit also includes a set of control terminals 220. A reference voltage is sent to level shifting circuit 218 from buffer 222 having control terminals 230 and an input terminal for receiving a control voltage 232 VAG.

The level shifted signal 224 is then sent to circuit 100. Circuit 100 receives the level shifted signal at the circuit's input terminal VCTL 102 where the signal is processed as discussed previously. Control input terminal VOXB 104 is preferably coupled to a control means such as a microprocessor or microcontroller in order to control the total amount of current drain by switching the current sink switches (MN1 and MN3 shown in FIG. 1). Also, shown is bias terminal 106 which biases the current sink FETs. The VOX circuit's output terminal VOXO 112 either sources or sinks current depending on the level of the signal present at the control input terminal VCTL 102.

Referring now to FIG. 3, a block diagram of a radio 300 utilizing a VOX circuit in accordance with the present invention is shown. Radio 300 includes conventional transmitter 316 and receiver 318 sections, which are selectively coupled to antenna 322 via antenna switch 320. A control means, such as a conventional microprocessor 314, controls the functioning of radio 300 by controlling the operation of transmitter 316 and receiver 318 as well as the VOX circuit 308 of the present invention.

A microphone 302 receives voice messages from the radio user and converts them into electrical signals which are then applied to microphone preamplifier 304 for signal amplification. The amplified signal is then sent to a bandpass filter for filtering of the signal prior to the signal being sent to VOX circuit 308. The signal which can be a differential or single ended signal is then processed by VOX circuit 308 as previously discussed. VOX circuit 308 controls the charging and discharging of capacitor C1.

VOX circuit 308 is similar to the VOX circuit block diagram shown on FIG. 2. The VOX circuit output terminal (VOXO 112 in FIG. 2) is coupled to microprocessor 314. The DC level at the output terminal 312 informs microprocessor 314 whether to keep transmitter 316 turned on, given that voice is appearing at microphone 302 presently or voice had appeared recently enough to still keep the transmitter "keyed up" (within the circuits release time parameter). The release time of VOX circuit 308 is controlled by microprocessor 314 via control line 310 which is coupled to the control input terminal of the VOX circuit.

In practice, the radio user can determine the type of release time that he wants to have and then sends a command to microprocessor 314 via a user control (e.g., radio keypad) to force microprocessor 314 to send a signal via control line 310 in order to set the release time for VOX circuit 308. The release time can be later modified if desired by the user if his operating conditions change (e.g., notices that his release time is to short due to long pauses in the radio users conversations) or he does not like his previous release time selection. The release time on the other hand can be programmed into the radio's memory (e.g., EEROM) which can be part of microprocessor 314, during the radios manufacture. This factory default release time set can be later modified by the radio user if desired. The present invention allows for all of the radio to be built with the same parts, with only the radio programming determining the release time that is to be utilized by each radio.

Figure 4:
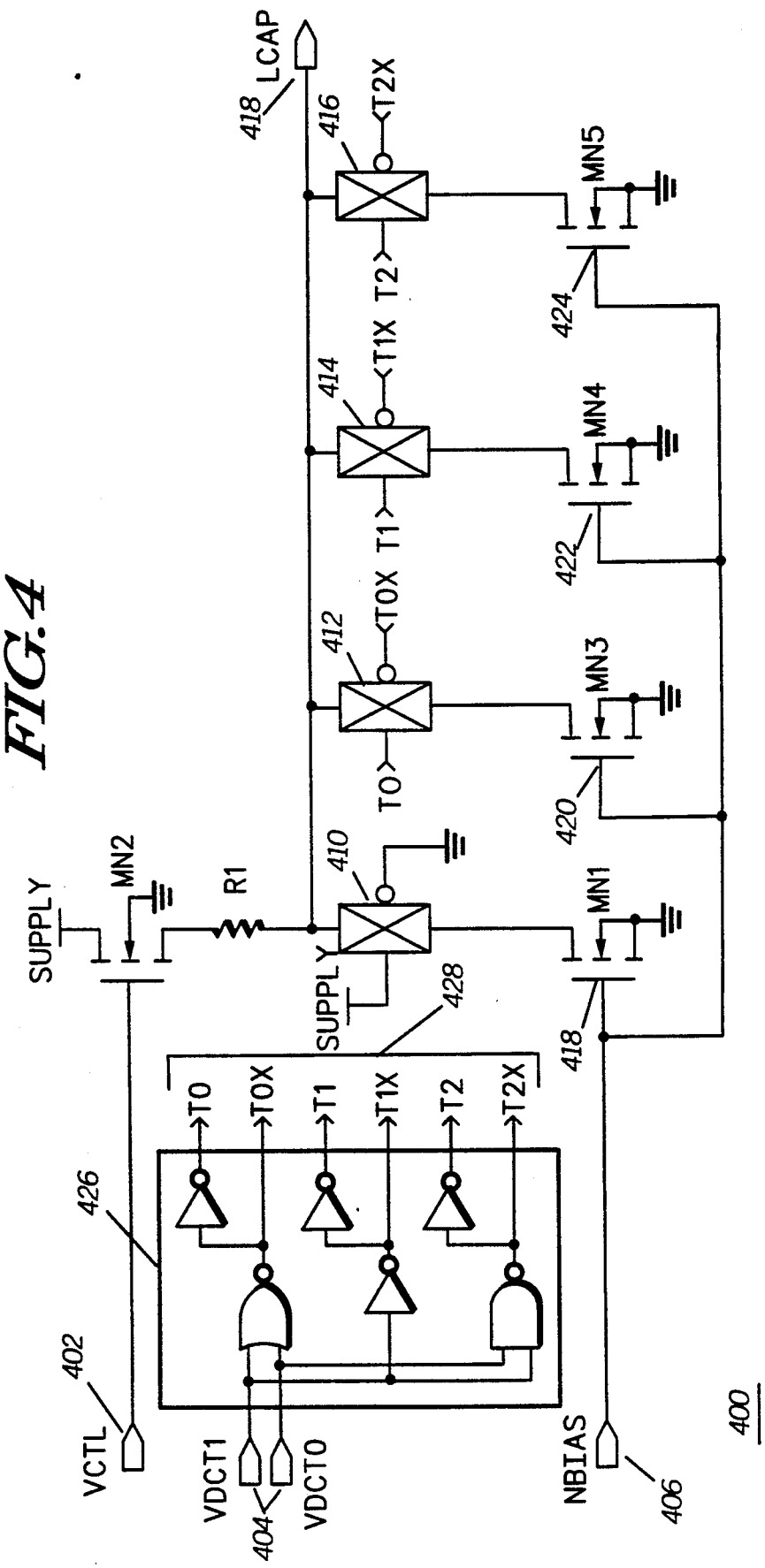
FIG. 4 is a schematic of another circuit having adjustable release time in accordance with the present invention.

In FIG. 4, a schematic of a circuit 400 having an adjustable release time in accordance with the present invention is shown. Circuit 400 is similar to the circuit 100 of FIG. 1, except that circuit 400 includes more current drain switches 410-416 providing for more current sink states providing different discharge current rates via FETs MN1, MN3-MN5. The signal applied by an external microprocessor controls the amount of current to sink via the VOX circuit in order to discharge capacitor C1.

Switch 410 is always "on" allowing for some current to drain via FET MN1 whenever the input signal at control input terminal VCTL 402 is at a low level, thereby allowing for the capacitor coupled to output LCAP 418 to discharge and release the control voltage present at capacitor C1 in order to "turn off" whatever circuit is relying on the voltage threshold present at output terminal 418. The current drain control circuitry 426 in FIG. 4 is more complex than that shown in FIG. 1 due to the fact that more discrete current sink paths are available via switches 410, 412, 414 and 416. Two control terminals VDCT0 and VDCT1 404 which are coupled to a microprocessor or other similar control device (not shown) allows for the modification of how much current is to be sunk from output terminal 418. For example the MN1 FET can be designed to sink 1.5 $\mu A$, MN3 0.5 $\mu A$, MN4 $2\mu$ and MN5 1 $\mu A$. Therefore, the control signals sent via release time control terminals VDCT0 and VDCT1 404 will determine how much current will be sunk from the capacitor coupled to output terminal LCAP 418. Current drain control circuitry 426 includes a plurality of control terminal pairs 428 which are coupled to their corresponding current switches 412, 414 and 416.

Figure 5:
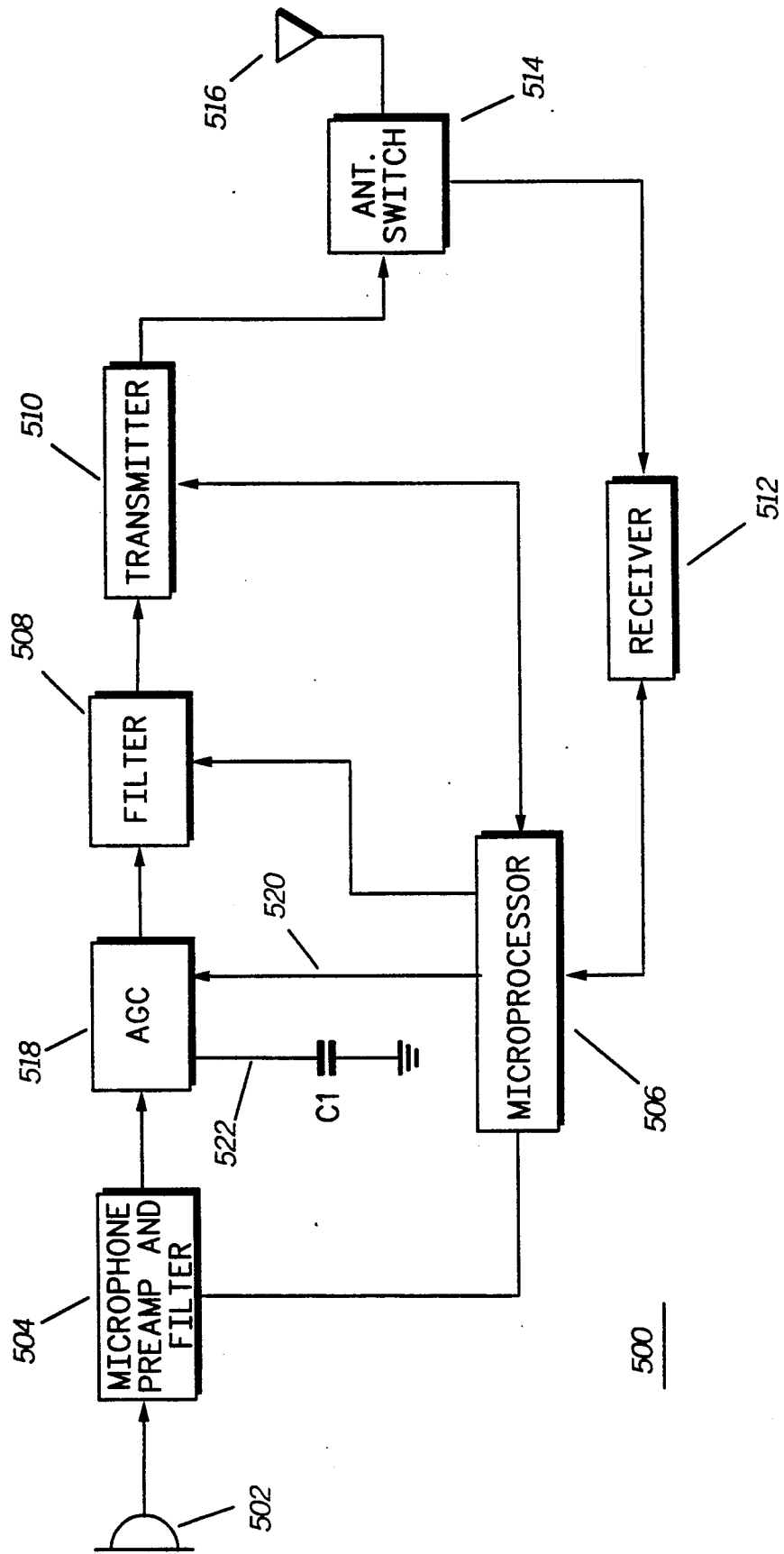
FIG. 5 is a block diagram of a radio having an AGC circuit which utilizes the circuit of FIG. 4 in accordance with the present invention.

Referring to FIG. 5, a block diagram of a radio 500 utilizing the circuit of FIG. 4 for use in an automatic gain control (AGC) circuit is shown. Radio 500 includes a microphone for receiving voice messages and converting them into electrical signals. The electrical signals are then sent to a conventional microphone preamplifier and filter stage for amplification and filtering of the signal. The filtered signal is then sent to an AGC circuit 518 which utilizes circuit 400 of the present invention. The output of the AGC circuit 518 is then sent to another filter stage 508 prior to being sent to transmitter 510 for transmission via antenna 516. A receiver 512 is also selectively coupled to antenna 516 via antenna switch 514. A controller, such as microprocessor 506, controls the operation of the radio as well as the release time of the AGC circuit 518 via bus 520.

Output line 522 provides a path for the output terminal (terminal 418 shown in FIG. 4) of the AGC circuit 400 to charge capacitor C1. Microprocessor 506 controls the discharge of external capacitor C1 by sending logic signals via bus 520 to the AGC release time control terminals (similar to terminals VDCT1 and VDCT0 404 in FIG. 4). Those skilled in the art will appreciate that the control signal from microprocessor 506 can sent via a parallel or serial bus architecture. If the control signal is sent via a serial bus the serial data can be decoded by appropriate conventional decoding circuitry which can be added to AGC circuit 518. In FIG. 4, the control signals are shown sent in parallel fashion via the use of two release time control terminals 404 (VDCT1 and VDCT0).

Figure 6:
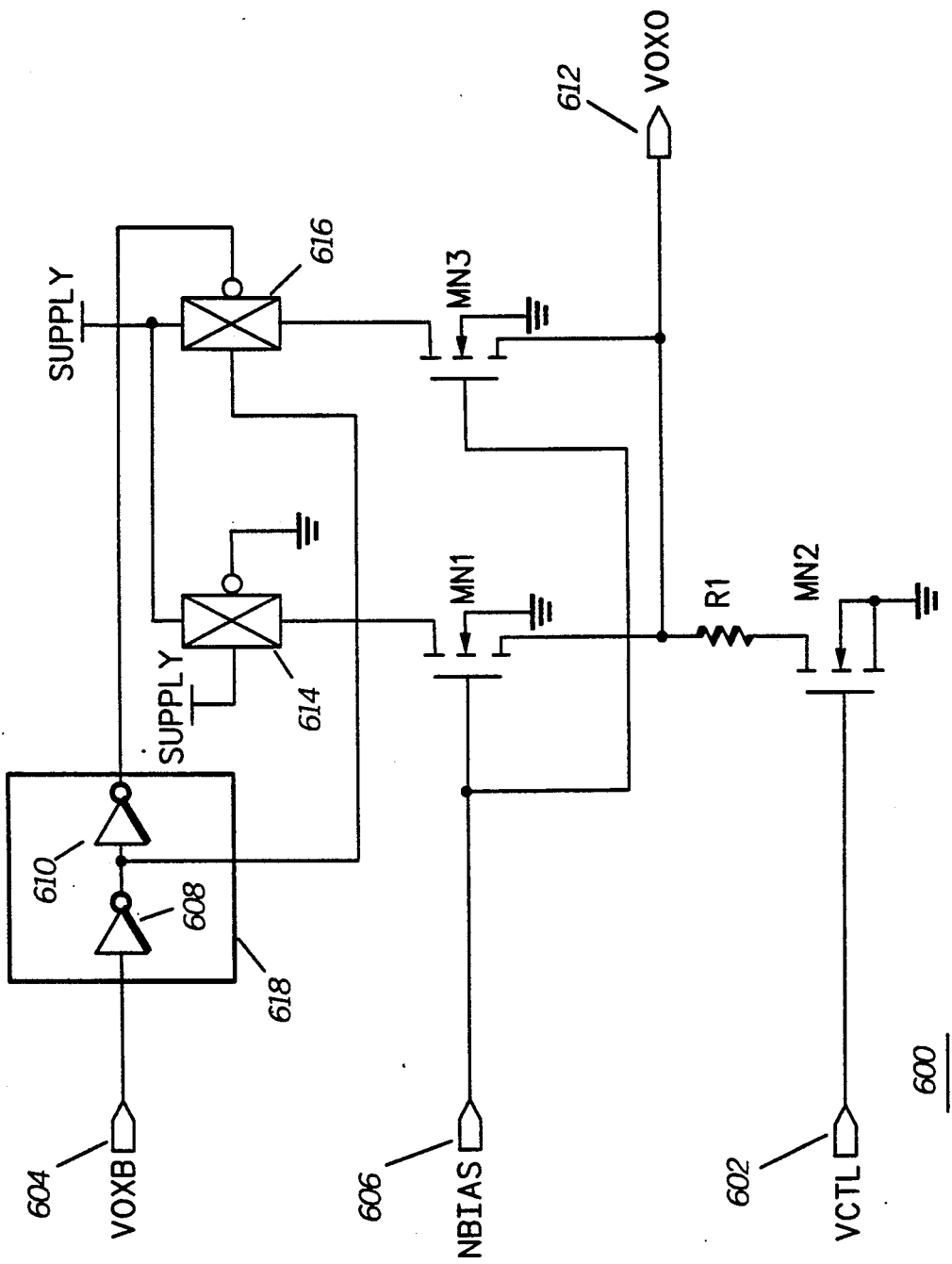
FIG. 6 is a schematic of a circuit with adjustable release time similar to the circuit in FIG. 1 having the sourcing and sinking means inverted from that shown in FIG. 1.

In FIG. 6, there is shown a circuit 600 similar to that of FIG. 1 having the source (attack time) and sink (release time) circuits reversed. In this circuit the attack time for charging the capacitor coupled to output terminal VOXO 612 is adjustable by determining if analog gate 616 is turned on via switch control circuit 618. In circuit 600 the output terminal has current sourced to it via the branch of analog gate (current sourcing switch) 614 and FET MN1 which are constantly turned on charging the capacitor (not shown) which is coupled to output terminal 612. When both analog gates 614 and 616 are "ON" more current is sourced to output terminal 612 thereby providing a faster attack time. An attack time control signal present at attack time control terminal VOXB 604 causes gate 616 to turn on, thereby increasing the current flowing to output VOXO 612 by the amount of current which the MN3 branch is designed to supply (e.g., 1 $\mu A$). Therefore, when both MN1 and MN3 are on the sum of the currents supplied by each of the branches will flow to output terminal 612. By designing more gate/FET branches which can be controlled via attack time control terminal 604 will give the circuit more flexibility as to the different sourcing currents available in order to charge the capacitor attached to the output terminal 612.

The sinking means for circuit 600 is provided by FET MN2 which sinks current from output terminal VOXO 612 via resistor R1 when an input signal is provided to the gate terminal of FET MN2 via input terminal VCTL 602 which causes MN2 to turn on. In summary, circuit 600 provides for an adjustable attack time (current sourcing) for the capacitor connected to output terminal 612 while providing for current sinking (release) via FET MN2.

The present invention provides for a circuit having adjustable release time (or adjustable attack time as shown in FIG. 6) which can be automatically or user controlled via a control circuit such as a microprocessor. The invention is fully integratable except for the capacitor which provides a definite advantage over the prior art. Utilizing a FET instead of a diode for the forward charging switch eliminates charge injection into the substrate, which would be substantial at the currents utilized for VOX or AGC circuits. The use of a FET also decreases the attack time of the circuit by increasing the available capacitor charging current.

The invention also provides for substantially temperature insensitive release times since the circuit utilizes current sources biased from a bandgap reference which is very temperature stable. These current sources are resistant to temperature swings which would affect the discharge resistor of the prior art. Finally, much longer release times can be achieved over those of prior circuits. This is due to the high impedance and controlled discharge rates of the current sources. By utilizing the present invention release times can approach the five second range with no degradation in attack times. This is not possible when using a resistor to discharge the external capacitor (C1 of FIG. 3 or FIG. 5) due to the exponential discharge characteristics of a resistor-capacitor RC circuit. By using current sources, the present invention provides for a very controlled linear decay of voltage versus time. While the external microprocessor discharge control capability allows for not only more dynamic control of the discharge but also savings in manufacturing. These savings being attributed to the fact that the same circuit can be utilized in different radios or other devices needing different release times without having to change any circuit components in order to customize the circuit to a particular need.

What is claimed is:
1. A radio, comprising:
  a transmitter; and
  a vox circuit coupled to a capacitor and the transmitter, the vox circuit comprising:
    a transistor having an input and output terminal, the output terminal coupled to the capacitor, the transistor responsive to an input signal of a predetermined threshold level at its input terminal for sourcing current to the capacitor; and
    a current sinking means for sinking current from the capacitor, the current sinking means including a release time control terminal and a plurality of current sink switches each coupled to a corre- sponding current sink element, the plurality of current sink switches are coupled in parallel to the transistor's output terminal, at least one of the plurality of current sink switches being operatively responsive to a release time control signal at the release time control terminal for changing the rate at which current is sunk from the capacitor.

2. A radio as recited in claim 1, further comprising a control means coupled to the release time control terminal for providing the release time control signal to the VOX circuit.

3. A radio as recited in claim 1, further comprising a microphone coupled to the VOX circuit for receiving audio messages and converting them to input signals, the magnitude of the input signals having to be of at least said predetermined threshold level prior to the transistor sourcing current to the capacitor.

4. A radio as recited in claim 1, wherein the current sink elements comprise a plurality of transistors, each of the plurality of transistors coupled between a corresponding one of the plurality of current sink switches and ground potential.

5. A radio as recited in claim 1, wherein the capacitor varies in DC voltage level and the control means is responsive to the variations in DC voltage level in order to control the operation of the transmitter.

6. A radio as recited in claim 2, wherein the control means comprises a microprocessor.

* * * * *